US007659756B2

(12) United States Patent
Walker

(10) Patent No.: US 7,659,756 B2
(45) Date of Patent: Feb. 9, 2010

(54) MOSFET TRANSISTOR AMPLIFIER WITH CONTROLLED OUTPUT CURRENT

(75) Inventor: James T. Walker, Palo Alto, CA (US)

(73) Assignee: Supertex, Inc.

( * ) Notice: Subject to any disclaimer, the term of this patent is extended or adjusted under 35 U.S.C. 154(b) by 0 days.

(21) Appl. No.: 11/535,152

(22) Filed: Sep. 26, 2006

(65) Prior Publication Data

US 2007/0069771 A1    Mar. 29, 2007

Related U.S. Application Data

(60) Provisional application No. 60/721,940, filed on Sep. 29, 2005.

(51) Int. Cl.
*H03F 3/18* (2006.01)
(52) U.S. Cl. .................. 327/112; 327/108; 326/83; 330/263; 330/264; 330/269
(58) Field of Classification Search ......... 327/108–112; 326/82, 83, 87; 330/262–264, 266, 267, 330/269, 272, 273
See application file for complete search history.

(56) References Cited

U.S. PATENT DOCUMENTS 4,417,263 A * 11/1983 Matsuura ................... 257/392
4,827,159 A * 5/1989 Naganuma .................. 326/27
5,126,589 A * 6/1992 Renger ....................... 327/111
5,216,293 A * 6/1993 Sei et al. ..................... 326/27
5,583,460 A * 12/1996 Dohi et al. .................. 327/126
5,729,165 A * 3/1998 Lou et al. .................... 327/112
6,847,235 B2 * 1/2005 Graves ........................ 327/106
6,992,511 B2 * 1/2006 Suzuki ....................... 327/112
7,023,247 B2 * 4/2006 Nii ............................ 327/112
7,332,942 B2 * 2/2008 Gotzenberger et al. ...... 327/109
7,355,445 B2 * 4/2008 Kimura ....................... 326/81

* cited by examiner

*Primary Examiner*—Lincoln Donovan
*Assistant Examiner*—Patrick O'Neill
(74) *Attorney, Agent, or Firm*—Jeffrey D. Moy; Weiss & Moy, P.C.

(57) ABSTRACT

A switched current source has a first voltage source, a second voltage source, and a third voltage source. A first transistor has a drain terminal coupled to one terminal of a load and a source terminal coupled to the third voltage source. A second transistor has drain, gate and source terminals. The drain terminal of the second transistor is coupled to the gate terminal of the first transistor. The source terminal of the second transistor is coupled to the source terminal of the first transistor. The gate terminal of the second transistor is coupled to the first voltage source. A third transistor has drain, gate and source terminals. The drain terminal of the third transistor is coupled to the gate terminal of the first transistor. The source terminal of the third transistor is coupled to the second voltage source. The gate terminal of the third transistor is coupled to the first voltage source.

15 Claims, 4 Drawing Sheets

MOSFET TRANSISTOR AMPLIFIER WITH CONTROLLED OUTPUT CURRENT

RELATED APPLICATION

This application is related to U.S. Provisional Application Ser. No. 60/721,940, filed Sep. 29, 2005, in the name of the same inventors listed above, and entitled, "MOSFET TRANSISTOR AMPLIFIER WITH CONTROLLED OUTPUT CURRENT". The present patent application claims the benefit under 35 U.S.C. §119(e).

FIELD OF THE INVENTION

The invention relates to a MOSFET amplifier circuit and, more specifically, to a MOSFET transistor amplifier circuit having a controlled output current.

BACKGROUND OF THE INVENTION

In some MOSFET amplifier applications it is desirable to control the maximum output current that is sent to the load. This is of particular importance when the load is capacitive and it is desired to have a well controlled rate of change of the load voltage during transitions. A particular application with this requirement is the driving of transducers for ultrasonic imaging systems, where the harmonic content of the waveforms applied to the transducers is of primary importance. In these systems the transducer is typically a piezoelectric ceramic material, and appears predominantly as a capacitive load, with other reactive and resistive characteristics also present.

Therefore, it would be desirable to provide an improved MOSFET amplifier circuit. The improved MOSFET amplifier circuit would be able to control the maximum output current that is sent to the load of the MOSFET amplifier circuit.

SUMMARY OF THE INVENTION

In accordance with one embodiment of the present invention, a switched current source is disclosed. The switched current source has a first voltage source, a second voltage source, and a third voltage source. A first transistor has a drain terminal coupled to one terminal of a load and a source terminal coupled to the third voltage source. A second transistor has drain, gate and source terminals. The drain terminal of the second transistor is coupled to the gate terminal of the first transistor. The source terminal of the second transistor is coupled to the source terminal of the first transistor. The gate terminal of the second transistor is coupled to the first voltage source. A third transistor has drain, gate and source terminals. The drain terminal of the third transistor is coupled to the gate terminal of the first transistor. The source terminal of the third transistor is coupled to the second voltage source. The gate terminal of the third transistor is coupled to the first voltage source.

In accordance with another embodiment of the present invention, a switched current source is disclosed. The switched current source has a first voltage source, a second voltage source, and a third voltage source. A first transistor has a drain terminal coupled to one terminal of a load and a source terminal coupled to the third voltage source. A second transistor has drain, gate and source terminals. The drain terminal of the second transistor is coupled to the gate terminal of the first transistor. The source terminal of the second transistor is coupled to the source terminal of the first transistor. The gate terminal of the second transistor is coupled to the first voltage source. A third transistor has drain, gate and source terminals. The drain terminal of the third transistor is coupled to the gate terminal of the first transistor. The source terminal of the third transistor is coupled to the second voltage source. The gate terminal of the third transistor is coupled to the first voltage source. A complimentary mirror switched current source circuit is coupled to the load to act as a current sink and allowing the switched current source to be a bi-directional current source.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, as well as a preferred mode of use, and advantages thereof, will best be understood by reference to the following detailed description of illustrated embodiments when read in conjunction with the accompanying drawings, wherein like reference numerals and symbols represent like elements.

DESCRIPTION OF PREFERRED EMBODIMENT

Figure 1:
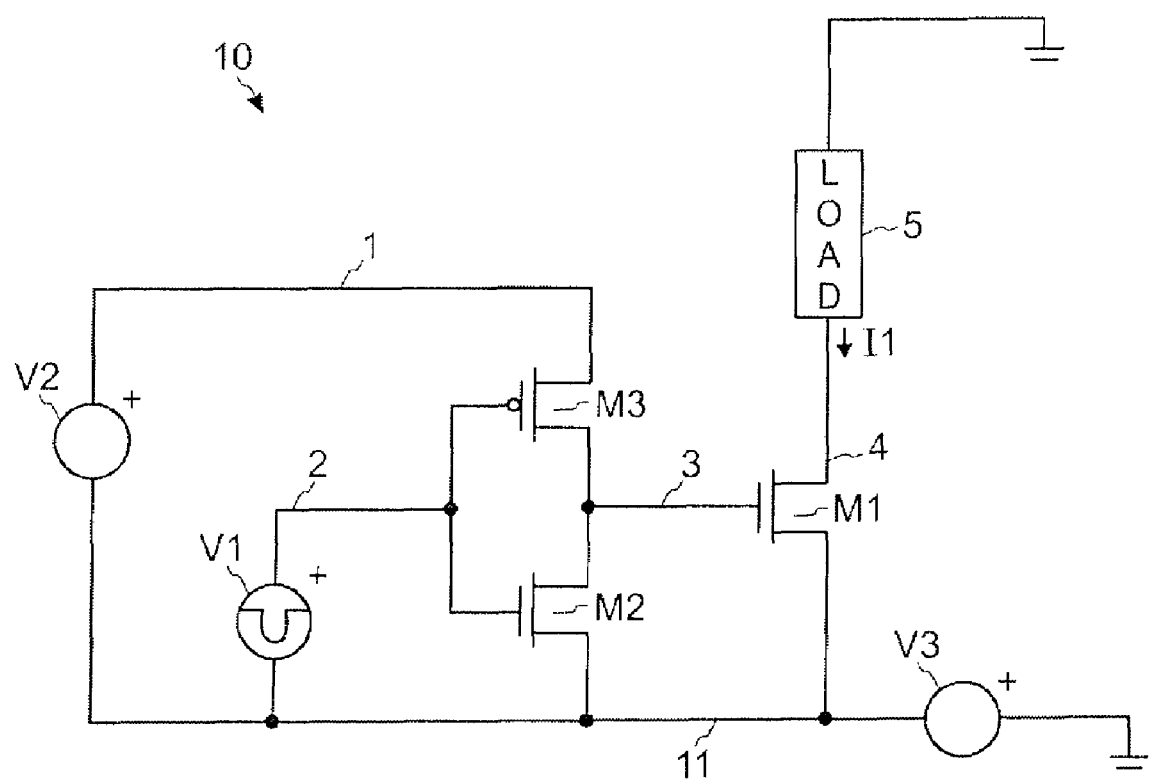
FIG. 1 is a simplified schematic of a circuit for controlling the drain current of a MOSFET used in an amplifier.

Referring to FIG. 1, a circuit 10 for controlling the drain current of a MOSFET used in an amplifier is shown. The transistor M1 is the signal amplifying transistor, with its power being provided by voltage source V3 and the signal voltage being developed across the terminals of load 5. The drain current I1 through the load 5 produces the signal voltage. Gate drive for M1 is provided by a CMOS inverter realized with devices M2 and M3. Power for the CMOS inverter is provided by supply V2.

When the input signal V1 at node 2 is greater than or equal to V2 at node 1, transistor M2 is in a conducting state and transistor M3 is not conducting. As a result the inverter output voltage at node 3 will be at the source potential of transistor M1. In this state, the output transistor M1 is off, and the drain current I1 through the load is zero. When the input signal V1 at node 2 is near the source potential of transistor M2, the inverter state is reversed. Transistor M3 is in a conducting state, and transistor M2 is not conducting. The resulting inverter output voltage at node 3 is then essentially the same as node 1. In this state, the output transistor M1 is in its conducting state, with the maximum value of drain current set by the value of the gate-source voltage derived from node 3 and node 11. Therefore variation of the voltage of the supply V2 can be used to control the maximum drain current of transistor M1, while the on or off state of M1 is controlled in turn by the independent input signal V1. The circuit will function correctly as long as the peak value of V1 is equal to or greater than V2.

The importance of this design is that the circuit 10 permits the maximum output current of the output transistor M1 to be determined by a signal or voltage V2 which is separate from the input signal V1. In turn, V1 determines whether the output is conducting or not. Therefore a voltage regulator may be used as a source of V2 to set the conduction properties of the output transistor M1 without knowledge of the actual signal waveform that is being amplified by M1. In these systems, the transistor M1 is typically either in a fully conducting state or a non-conducting state. M1 is not required to provide linear amplification or partial conduction.

In applications where the load contains a resistive or DC conductive component, the circuit 10 of FIG. 1 will operate correctly. However, if the load is capacitive or will not conduct a DC current, a separate means must be provided for conducting the average current drawn by the drain of M1.

Figure 2:
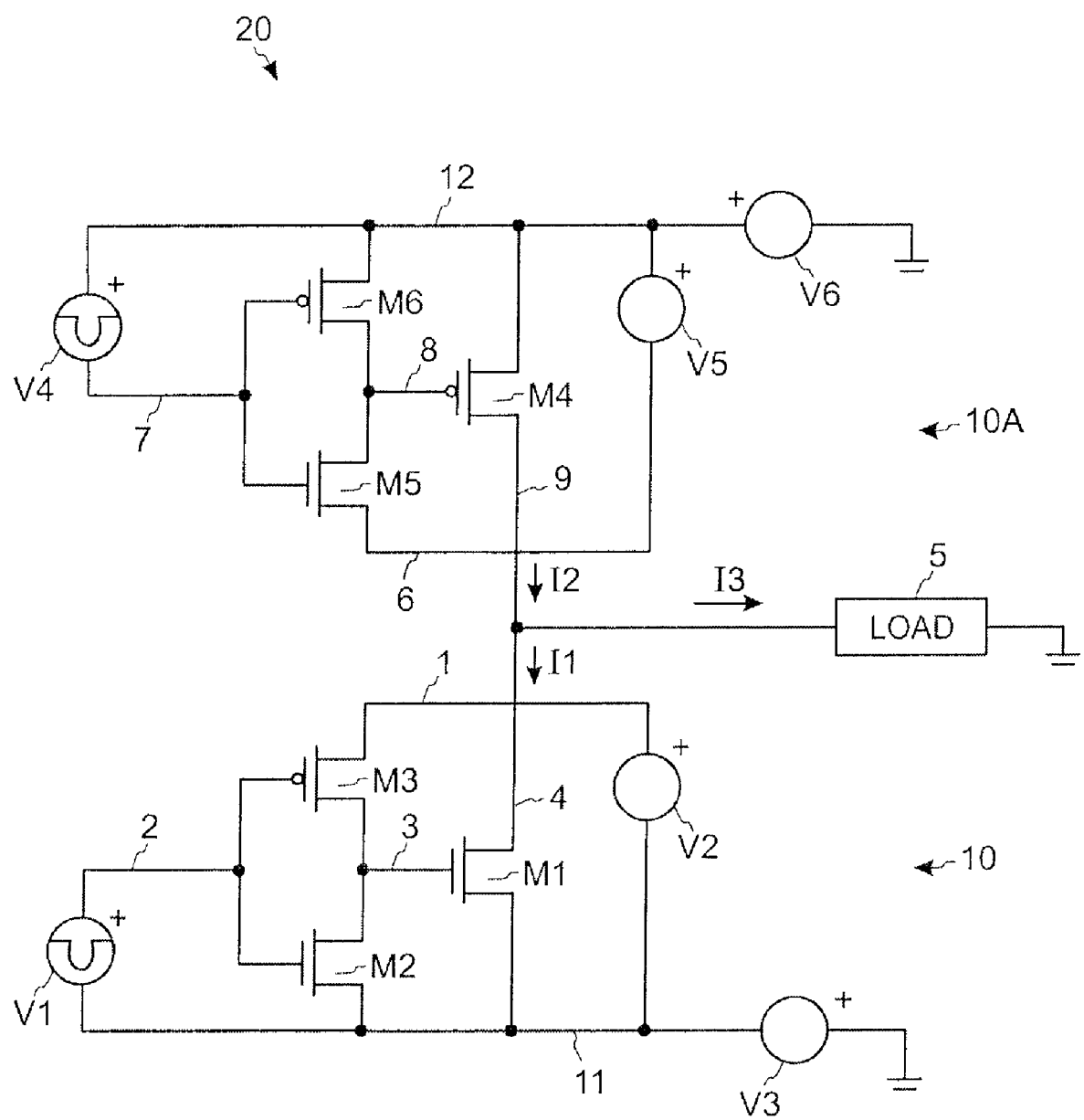
FIG. 2 is a simplified schematic of a current controlled bidirectional output stage.

Referring to FIG. 2, a bi-directional amplifier stage 20 that overcomes the above problem is shown. The circuit 20 will thus conduct an average current drawn by the drain of M1 if the load is capacitive or will not conduct a DC current. In the circuit 20, a second amplifier 10A that is complementary to the amplifier 10 of FIG. 1 is added using M4 as its output transistor, and M5 and M6 as the source of gate drive voltage for M4. By this method when M1 conducts, its drain current I1 sinks current out of the load 5, and when M4 conducts, its drain sources current to the load 5. Thus, the composite current I3 to the load, which is I2 minus I1, becomes a bi-directional current capable of both charging and discharging a capacitive or capacitively coupled load which will not pass significant DC current.

In FIG. 2, the transistors M1, M2, and M3 and sources V1, V2, and V3 operate in a manner similar to that described previously for FIG. 1. The power source V3 is located at the source side of M1 for convenience. The circuit portion containing M4, M5, M6, V4, V5, and V6 is symmetrically constructed to be able to source current I2 into the load for bi-directional operation. When V4 is greater than V5, the output of the CMOS inverter formed by M5 and M6 at node 8 is at the potential V6 of node 12, causing transistor M4 to be in a non-conducting state. When V4 is near zero, the output of the CMOS inverter formed by M5 and M6 at node 8 is at the potential of (V6-V5), applying the voltage V5 to the gate-to-source terminals of transistor M4. Thus the maximum drain current in this case is set by the conduction properties of M4 with the voltage V5 applied to its gate-to-source terminals.

The overall performance of FIG. 2 is that when input V1 is zero, transistor M1 turns on with a drain current limited by the gate drive from the voltage V2, and when input V4 is zero, transistor M4 turns on with a drain current limited by the gate drive from the voltage V5. In both cases, if the other transistor M1 or M4 is not conducting, and the load is capacitive or draws a sufficiently small current, the output voltage at 9 will ultimately go to a value near the available supply voltages. When M1 conducts, the limiting voltage is set by V3, and M1 in that case functions in its substantially resistive operating mode. Conversely, when M4 conducts, the limiting voltage is set by V6, and M4 in that case functions in its substantially resistive operating mode. If both M1 and M4 are conducting, then the voltage and current applied to the load terminal is in an in-between state.

During the transitions of the voltage at node 9 from M1 to M4 conducting or the reverse, the voltage rate of change (slew rate) at node 9 is determined primarily by the load capacitance component and the drain currents of M1 and M4. Therefore control of the voltages V2 and V5 will in turn control the slew rate at node 9. The timing of the voltage changes at node 9 will be determined by the input control signals V1 and V4, independent of the slew rates.

Figure 3:
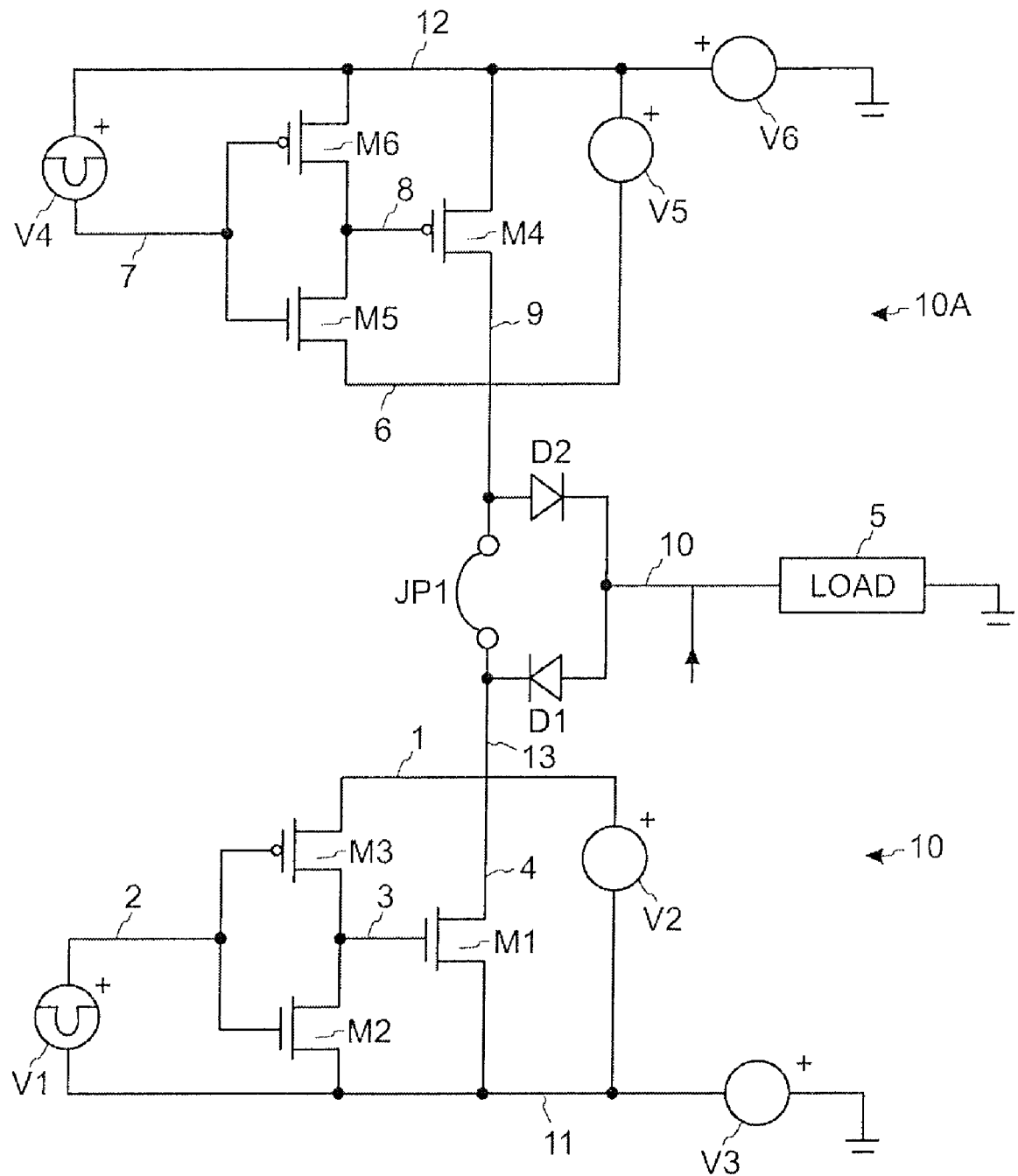
FIG. 3 is a simplified schematic of a current controlled bidirectional output stage with diodes.

FIG. 3 shows a variation of the circuit of FIG. 2 in which a pair of diodes D1 and D2 is added to the circuit. The diodes D1 and D2 permit the load voltage at node 10 to exceed the supply voltages V3 and V6. In this case, it is possible to connect several drive circuits similar to FIG. 3 with their outputs at node 10 in parallel. The driver with the highest supply voltage and a conducting output transistor will have a conducting diode connecting it to the load, and the other diodes will be non-conducting. A system configuration of this type is capable of generating an output pulse train containing several voltage levels, including zero. To get an approximately zero output voltage level, the supplies V3 and V6 of the associated driver section are set to zero. The jumper JP1 may be used to short the nodes 9 and 13 together for improved dynamic response in the highest output voltage driver section.

Since the conduction properties of transistors M1 and M4 are a function of the fabrication process used and its variations, as well as device size and temperature, means may be employed to remove the effects of these variations from the output waveform. This is conveniently done in FIG. 2 by providing voltage regulators to function as the sources for V2 and V5. Circuitry may then be built into these regulators as known in the state of the art to cause the regulator output voltage to vary with temperature. Additionally, the regulator outputs may also be made to vary in a manner similar to the properties of transistors M1 and M4. For example, if a transistor similar to M1 is incorporated into the regulator for V2, then when the conduction properties of M1 vary, the regulator output voltage V2 will vary in a way to cancel the effect. Use could additionally be made of the monolithic matching of similar transistors fabricated in the same integrated circuit to achieve this effect. The regulator does not have to be fabricated in the same circuit as the transistor M1 as long as it is able to properly respond to the environmental influences that cause M1 to change.

Figure 4:
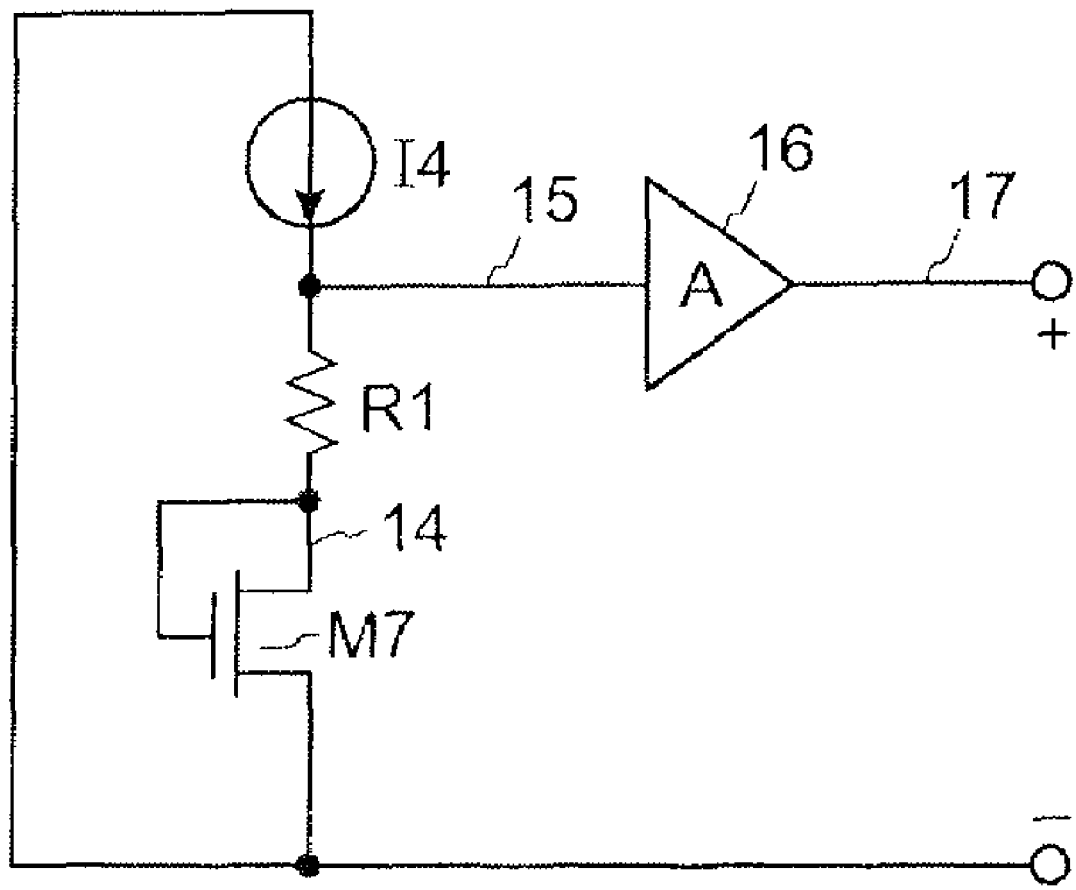
FIG. 4 is a simplified schematic of a voltage regulator used in the current controlled bidirectional output stage of FIGS. 2 and 3.

As an example, consider the regulator structure of FIG. 4. In this circuit, a reference current I4, generated by a circuit well known in the state of the art, is used to power a series string composed of resistor R1 and transistor M7. The reference current may incorporate a non-zero temperature dependency if desired, or be stable with temperature. Likewise, resistor R1 may be either constant or a function of temperature. The voltage at node 14 will contain variations which are chosen to mimic the variations present in the output transistors M1 or M4 as a function of temperature and fabrication process variations. In addition, the voltage drop across resistor R1 adds to the voltage at node 14 to determine a voltage at node 15 such that the drain current of transistor M1 or M4 will have the desired characteristics. Normally resistor R1, current I4, and transistor M7 will all vary with temperature. Proper choice of each of their characteristics will enable the drain current of M1 or M4 to be made stable with temperature and process variations, so that the overall system performance will not vary.

Additionally, a means may be provided for adjustment of the value of the resistor R1 or transistor M7 after the circuit is fabricated. In this way, calibration may be done to match the regulator and bipolar driver performance to the desired overall system requirements.

As shown in FIG. 4, in order to provide a voltage source to the driver circuits in FIGS. 2 and 3, an amplifier 16 with a gain of A and a low output impedance is added to the voltage source made with I4, R1 and M7. The low output impedance of the amplifier 16 provides the current needed to drive the capacitance of the gate of transistors M1 and M4 at the signal switching frequency. Voltage gain may also be provided to scale the voltage at node 15 to the value needed at node 17 for V2 or V5. For V5, the circuit may be built in complementary form with a PMOS transistor for M7, and the polarity of I4 reversed.

Any other voltage source, regulator, or amplifier means as is known in the state of the art may be alternatively employed to produce the voltages V2 and V5.

For the circuits of FIGS. 2 and 3, a pair of voltage regulators of function similar to FIG. 4 is required. These are then used as the voltage sources for V2 and V5. The two voltage regulator circuits may have different characteristics as needed to match the corresponding output transistors M1 and M4. The overall system result is that the drain currents of M1 or M4 are made stable with temperature and process variations as desired. It is also possible to make the voltage sources V2 and V5 vary so that the operation of the output transistors M1 and M4 is not stable, but varies in a desired and predictable way for some other system purpose.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A switched current source comprising:
a first voltage source, wherein the first voltage source is an independent controlled voltage source;
a second voltage source;
a third voltage source;
a first transistor having a drain terminal connected to one terminal of a load and a source terminal connected to the first voltage source, the second voltage source, and the third voltage source;
a second transistor having drain, gate and source terminals wherein the drain terminal of the second transistor is connected to the gate terminal of the first transistor, the source terminal of the second transistor is connected to the source terminal of the first transistor, the first voltage source and the second voltage source, and the gate terminal of the second transistor is connected to the first voltage source; and
a third transistor having drain, gate and source terminals wherein the drain terminal of the third transistor is connected to the gate terminal of the first transistor, the source terminal of the third transistor is connected to the second voltage source, and the gate terminal of the third transistor is connected to the first voltage source;
a complimentary mirror switched current source circuit coupled to the load to act as a current sink and allowing the switched current source to be a bi-directional current source, wherein the complimentary mirror circuit comprises:
a fourth voltage source;
a fifth voltage source;
a sixth voltage source;
a fourth transistor having drain, gate and source terminals wherein a drain terminal of the fourth transistor is connected to one terminal of the load and a source terminal of the fourth transistor is connected to the sixth voltage source;
a fifth transistor having drain, gate and source terminals wherein the drain terminal of the fifth transistor is connected to the gate terminal of the fourth transistor, the source terminal of the fifth transistor is connected to the fifth voltage source, and the gate terminal of the fifth transistor is connected to the fourth voltage; and a sixth transistor having drain, gate and source terminals wherein the drain terminal of the sixth transistor is connected to the gate terminal of the fourth transistor, the source terminal of the sixth transistor is connected to the sixth voltage source, and the gate terminal of the sixth transistor is connected to the fourth voltage source;
a first diode having a first terminal connected to the load and a second terminal connected to the drain of the first transistor;
a second diode, a first terminal of the second diode connected to the drain of the fourth transistor and a second terminal of the second diode connected to the load;
a jumper to short the second terminal of the first diode to the first terminal of the second diode together for improved dynamic response;
wherein the third transistor is conducting when the first voltage source is approximately near a source potential of the second transistor causing the first transistor to conduct, a maximum output current through the load controllable by varying the second voltage source;
wherein the fifth transistor is conducting when the fourth voltage source is approximately near zero causing the fourth transistor to conduct, a maximum output current through the load controllable by varying the fifth voltage source.

2. A switched current source in accordance with claim 1 wherein the first transistor, the second transistor and the third transistor are MOSFETS.

3. A switched current source in accordance with claim 1 wherein the second voltage source is used to control a maximum drain current of the first transistor.

4. A switched current source in accordance with claim 3 wherein the first voltage source is used to control a conduction state of the first transistor.

5. A switched current source in accordance with claim 1 wherein the fourth transistor, the fifth transistor and the sixth transistor are MOSFETS.

6. A switched current source in accordance with claim 1 wherein the fifth voltage source is used to control a maximum drain current of the fourth transistor.

7. A switched current source in accordance with claim 6 wherein the fourth voltage source is used to control a conduction state of the fourth transistor.

8. A switched current source in accordance with claim 1 wherein the second voltage source incorporates temperature and process variability.

9. A switched current source in accordance with claim 1 wherein the second and fifth voltage sources incorporates temperature and process variability.

10. A switched current source comprising:
a first voltage source, wherein the first voltage source is an independent controlled voltage source;
a second voltage source;
a third voltage source;
a fourth voltage source, wherein the fourth voltage source is an independent controlled voltage source;
a fifth voltage source;
a sixth voltage source;
a first transistor having a drain terminal connected to one terminal of a load and a source terminal connected to the first voltage source, the second voltage source, and the third voltage source;
a second transistor having drain, gate and source terminals wherein the drain terminal of the second transistor is connected to the gate terminal of the first transistor, the source terminal of the second transistor is connected to the source terminal of the first transistor, the first voltage source and the second voltage source, and the gate terminal of the second transistor is connected to the first voltage source; and a third transistor having drain, gate and source terminals wherein the drain terminal of the third transistor is connected to the gate terminal of the first transistor, the source terminal of the third transistor is connected to the second voltage source, and the gate terminal of the third transistor is connected to the first voltage source;

a fourth transistor having drain, gate and source terminals wherein a drain terminal of the fourth transistor is connected to one terminal of the load and a source terminal of the fourth transistor is connected to the sixth voltage source;

a fifth transistor having drain, gate and source terminals wherein the drain terminal of the fifth transistor is connected to the gate terminal of the fourth transistor, the source terminal of the fifth transistor is connected to the fifth voltage source, and the gate terminal of the fifth transistor is connected to the fourth voltage; and a sixth transistor having drain, gate and source terminals wherein the drain terminal of the sixth transistor is connected to the gate terminal of the fourth transistor, the source terminal of the sixth transistor is connected to the sixth voltage source, and the gate terminal of the sixth transistor is connected to the fourth voltage source;

wherein a maximum output current of the first transistor is determined by the second voltage source which is separate from the first voltage source;

wherein a maximum output current of the fourth transistor is determined by the fifth voltage source which is separate from the fourth voltage source;

a first diode having a first terminal connected to the load and a second terminal connected to the drain of the first transistor;

a second diode, a first terminal of the second diode connected to the drain of the fourth transistor and a second terminal of the second diode connected to the load;

a jumper to short the second terminal of the first diode to the first terminal of the second diode together for improved dynamic response.

11. A switched current source in accordance with claim 10 wherein the second and fifth voltage sources incorporates temperature and process variability.

12. A switched current source in accordance with claim 10 wherein the first, second, third, fourth, fifth and sixth transistors are MOSFETS.

13. A switched current source comprising:

a first voltage source;

a second voltage source;

a third voltage source;

a first transistor having a drain terminal coupled to one terminal of a load and a source terminal coupled to the third voltage source;

a second transistor having drain, gate and source terminals wherein the drain terminal of the second transistor is coupled to the gate terminal of the first transistor, the source terminal of the second transistor is coupled to the source terminal of the first transistor, and the gate terminal of the second transistor is coupled to the first voltage source; and a third transistor having drain, gate and source terminals wherein the drain terminal of the third transistor is coupled to the gate terminal of the first transistor, the source terminal of the third transistor is coupled to the second voltage source, and the gate terminal of the third transistor is coupled to the first voltage source;

a complimentary mirror switched current source circuit coupled to the load to act as a current source and allowing the switched current source to be a bi-directional current source;

a first diode having a first terminal connected to the load and a second terminal connected to the drain of the first transistor;

a second diode, a first terminal of the second diode connected to the drain of a fourth transistor of the complimentary mirror switched current source circuit and a second terminal of the second diode connected to the load; and a jumper to short the second terminal of the first diode to the first terminal of the second diode together for improved dynamic response.

14. A switched current source in accordance with claim 13 wherein the second voltage source is used to control a maximum drain current of the first transistor.

15. A switched current source in accordance with claim 14 wherein the first voltage source is used to control a conduction state of the first transistor.

* * * * *